(12) United States Patent
Sakai et al.

(10) Patent No.: US 8,124,985 B2
(45) Date of Patent: Feb. 28, 2012

(54) SEMICONDUCTOR LIGHT EMITTING DEVICE AND METHOD FOR MANUFACTURING THE SAME

(75) Inventors: Mitsuhiko Sakai, Kyoto (JP); Atsushi Yamaguchi, Kyoto (JP); Ken Nakahara, Kyoto (JP); Masayuki Sonobe, Kyoto (JP); Tsuyoshi Tsutsui, Hyogo (JP)

(73) Assignee: Rohm Co., Ltd., Kyoto (JP)

( * ) Notice: Subject to any disclaimer, the term of this patent is extended or adjusted under 35 U.S.C. 154(b) by 548 days.

(21) Appl. No.: 11/815,759

(22) PCT Filed: Feb. 7, 2006
(Under 37 CFR 1.47)

(86) PCT No.: PCT/JP2006/302026
§ 371 (c)(1),
(2), (4) Date: Jul. 22, 2009

(87) PCT Pub. No.: WO2006/085514
PCT Pub. Date: Aug. 17, 2006

(65) Prior Publication Data
US 2010/0019257 A1 Jan. 28, 2010

(30) Foreign Application Priority Data
Feb. 8, 2005 (JP) .................. 2005-031682
Dec. 20, 2005 (JP) .................. 2005-366961

(51) Int. Cl.
*H01L 27/15* (2006.01)
*H01L 29/26* (2006.01)
*H01L 31/12* (2006.01)
*H01L 33/00* (2010.01)
(52) U.S. Cl. ........ 257/79; 257/85; 257/96; 257/E33.005
(58) Field of Classification Search .................. 257/79, 257/85, 96, E33.005
See application file for complete search history.

(56) References Cited

U.S. PATENT DOCUMENTS
7,075,115 B2 * 7/2006 Sakamoto et al. .............. 257/98
2001/0045562 A1 11/2001 Uemura et al.
2004/0124422 A1 7/2004 Sakamoto et al.
(Continued)

FOREIGN PATENT DOCUMENTS
DE 4427840 A1 2/1996
(Continued)

*Primary Examiner* — Phat Cao
(74) *Attorney, Agent, or Firm* — Rabin & Berdo, P.C.

(57) ABSTRACT

There are provided a nitride semiconductor light emitting device having a structure enabling enhanced external quantum efficiency by effectively taking out light which is apt to repeat total reflection within a semiconductor lamination portion and a substrate and attenuate, and a method for manufacturing the same. A semiconductor lamination portion (6) including a first conductivity type layer and a second conductivity type layer, made of nitride semiconductor, is provided on a surface of the substrate (1) made of, for example, sapphire or the like. A first electrode (for example, p-side electrode (8)) is provided electrically connected to the first conductivity type layer (for example, p-type layer (5)) on a surface side of the semiconductor lamination portion (6), and a second electrode (for example, n-side electrode (9)) is provided electrically connected to the second conductivity type layer (for example, n-type layer (3)). A part of the semiconductor lamination portion (6) is removed at a surrounding region of a chip of the semiconductor lamination portion (6) by etching so that column portions (6a) stand side by side by leaving the semiconductor lamination portion without etching, and the n-type layer (3) expose around the column portions (6a).

7 Claims, 4 Drawing Sheets

U.S. PATENT DOCUMENTS

2004/0206969 A1 10/2004 Orita

FOREIGN PATENT DOCUMENTS

| DE | 10224219 | A1 | 12/2003 |
| EP | 1396891 | A2 | 3/2004 |
| EP | 1548849 | | 6/2005 |
| JP | 2000-299494 | | 10/2000 |
| JP | 2005-33197 | | 2/2005 |
| WO | WO-2005/004247 | A1 | 1/2005 |

* cited by examiner (a)

(b)

SEMICONDUCTOR LIGHT EMITTING DEVICE AND METHOD FOR MANUFACTURING THE SAME

FIELD OF THE INVENTION

The present invention relates to a semiconductor light emitting device, in which nitride semiconductor layers are laminated on a substrate and emits blue type light (from ultraviolet rays to yellow light) and a method for manufacturing the same. More particularly, the present invention relates to a semiconductor light emitting device using nitride semiconductor and having a structure in which it is made easy to take out light reflected from a substrate side by forming unevenness on an exposed lower semiconductor layer, by leaving parts of a semiconductor lamination portion so as to stand side by side in a region, where a lower conductivity type layer of the semiconductor lamination portion is exposed by etching a part of the semiconductor lamination portion at least at a surrounding region of a chip, and relates to a method for manufacturing the same.

BACKGROUND OF THE INVENTION

As shown, for example, in FIG. 7, a semiconductor light emitting device emitting blue type light by the prior art is formed by forming a semiconductor lamination portion 36 on a sapphire substrate 31. The semiconductor lamination portion is formed by laminating a low temperature buffer layer 32 made of GaN or the like, an n-type layer 33 made of GaN or the like, an active layer (light emitting layer) 34 made of, for example, an InGaN based compound semiconductor (which means that a ratio of In to Ga can be varied variously and the same applies hereinafter), which has a smaller band gap energy than that of the n-type layer 33 and decides a wavelength of emitting light, and a p-type layer 35 made of GaN or the like. And a p-side (upper) electrode 38 is provided on a surface interposing a light transmitting conductive layer 37, and an n-side (lower) electrode 39 is provided on a surface of the n-type layer 33 exposed by etching a part of the semiconductor lamination portion 36. In this structure, a semiconductor layer having still larger band gap energy such as an AlGaN based (which means that a ratio of Al to Ga can be varied variously and the same applies hereinafter) compound or the like may be employed on the active layer side of the n-type layer 33 and the p-type layer 35 in order to increase an effect of carrier confinement.

When the n-type layer 33 which is a lower semiconductor layer of the semiconductor lamination portion 36 is exposed by etching a part of the semiconductor lamination portion 36 in order to form the n-side electrode 39, etching is carried out at a region of a width A surrounding the chip at the same time as shown in FIG. 7. Such etching at the surrounding region of the chip is carried out for separating light emitting layer forming portions into chips by a dry etching process not so as to occur with cracks or the like in the light emitting layer because it is difficult to dice or scribe nitride semiconductor layers due to its hardness. Therefore, taking into account a tolerance such as a positional displacement or the like on a dicing process of a substrate, the width A of the surrounding region of the chip is approximately 25 to 40 μm in case of a chip size B of approximately 400 μm.

On the other hand, nitride semiconductor also has a refractive index of approximately 2.5 far larger than 1, which is that of air, as same as other compound semiconductor. Therefore, light which is generated in the light emitting layer of the nitride semiconductor layer and travels toward outside easily reflects totally at the boundary between the semiconductor lamination portion and air, and much of the light is not taken out of the semiconductor lamination portion, but is apt to repeat total reflection and attenuates within the semiconductor lamination portion, and as a result, efficiency of taking light out becomes remarkably low such as an order of 10%. In order to solve such problem, there has been introduced an idea, shown in, for example, FIG. 8, in which unevenness is formed on circumferences of a chip so as to make light from a semiconductor lamination portion easy to radiate outside, in compound semiconductor such as GaP based, AlGaInP based, AlGaAs based, or the like (cf. for example PATENT DOCUMENT 1). Namely, as shown in FIG. 8, a semiconductor lamination portion 44 is formed by growing epitaxially an n-type GaP layer 42 and a p-type GaP layer 43 on an n-type GaP substrate 41, and a p-side electrode 46 having a structure of three layers is formed on a surface thereof, an n-side electrode 47 on a back surface of the GaP substrate 41. And after dicing into chips, the unevenness 44a is formed on a surface of an LED chip by a surface-roughening treatment of etching with, for example, hydrochloric acid.

PATENT DOCUMENT 1: Japanese Patent Application Laid-Open No. 2000-299494

DISCLOSURE OF THE INVENTION

Problem to be Solved by the Present Invention

As described above, although light, emitted in a semiconductor lamination portion formed by laminating semiconductor layers so as to form a light emitting layer, can be utilized by being radiated outside from the semiconductor lamination portion, it is difficult to take out the light since probability of occurrence of total reflection is high because a refractive index of semiconductor is considerably large compared to that of air, therefor, external quantum efficiency can not be raised. On the contrary, although, by forming unevenness on outer circumferences of a LED chip, the light becomes easy to be taken out because the total reflection is apt to inhibited by the unevenness on the surface, a surface of nitride semiconductor can not be roughened by a wet etching process because nitride semiconductor is a material very stable chemically. In addition, a nitride semiconductor light emitting device is provided with the light transmitting conductive layer 37 on a surface of the semiconductor lamination portion 36, as shown in FIG. 7 described above, because it is difficult to raise carrier density of nitride semiconductor layers, especially of a p-type nitride semiconductor layer. And the light transmitting conductive layer 37 is composed of a thin film made of Au, Au—Ni alloy or the like, and wet etching can be carried out. Though, since the light transmitting conductive layer 37 is originally provided in order to diffuse electric current, function of diffusing electric current is deteriorated if the layer is etched, light can not transmit if the layer is formed thicker taking etching into account, and then, there rises a problem such that the external quantum efficiency is finally lowered.

The present invention is directed to solve the above-described problems and an object of the present invention is to provide a nitride semiconductor light emitting device having a structure capable of raising external quantum efficiency by taking out light effectively without attenuation of light caused by repetition of total reflection within a semiconductor lamination portion and a substrate, and to provide a method for manufacturing the same.

Another object of the present invention is to provide a nitride semiconductor light emitting device having a structure capable of further raising the external quantum efficiency by taking out light effectively without attenuation and absorption of light, which is transmitted from a center part of a chip (mesa structure portion) of the semiconductor lamination portion to a side direction, and to provide a method for manufacturing the same.

Means for Solving the Problem

A semiconductor light emitting device according to the semiconductor includes; a substrate, a semiconductor lamination portion made of nitride semiconductor, including a first conductivity type layer and a second conductivity type layer and provided on the substrate, a first electrode provided electrically connected to the first conductivity type layer which is provided on a surface side of the semiconductor lamination portion, and a second electrode provided electrically connected to the second conductivity type layer, wherein a mesa structure portion of the semiconductor lamination portion is formed by etching a part of the semiconductor lamination portion at a surrounding region of a chip so as to expose the second conductivity type layer, and column portions are formed by leaving parts of the semiconductor lamination portion such that the column portions stand side by side. The column portions are preferably formed such that each height is from 0.5 to 5 μm and may be formed in a structure, in which they are arranged with a shift by a half pitch between adjacent rows, or the like.

Here, the nitride semiconductor means a compound of Ga of group III element and N of group V element or a compound (nitride) in which a part or all of Ga of group III element substituted by other element of group III element like Al, In or the like and/or a part of N of group V element substituted by other element of group V element like P, As or the like.

It is preferable to set a distance between a side wall of the mesa structure portion and a column portion which is the nearest column portion to the side wall at least 0.5 μm or more because irradiation of light emitted in the mesa structure becomes hard to be shut. In addition, It is preferable that the semiconductor lamination portion has an active layer between the first conductivity type layer and the second conductivity type layer, and the column portions are shortened so that a top surface of each of the column portions is lower than that of a position of the active layer, because irradiation of light emitted in the active layer of the mesa structure becomes more hard to be shut.

The semiconductor light emitting device may be formed such that the substrate is formed with an insulating substrate, the second conductivity type layer is exposed by etching a part of the semiconductor lamination portion, the second electrode is provided on a surface of the exposed second conductivity type layer, and the column portions are formed on a surrounding region of the second electrode. In case that the substrate is formed with a semiconductor substrate, parts of the semiconductor lamination portion of a column shape may be formed only in a surrounding region of a chip and the second electrode may be formed on a back surface of the semiconductor substrate.

A method for manufacturing the nitride semiconductor light emitting device according to the present invention includes the steps of; forming a semiconductor lamination portion by laminating nitride semiconductor layers so as to form a light emitting layer on a surface of a wafer-shaped substrate, forming a mask for etching on the semiconductor lamination portion so that the semiconductor lamination portion is etched at a surrounding region of each chip to form a mesa structure portion, and column portions stand side by side at the surrounding region of each chip, forming the mesa structure portion of the semiconductor lamination portion and the column portions by etching up to exposure of a semiconductor layer which is a conductivity type of the substrate side, and forming a light emitting device chip by dividing the wafer-shaped substrate on which the semiconductor lamination portion is formed into chips at a part of the column portions.

It is more preferable that the semiconductor lamination portion is formed by a double hetero junction structure composed of an n-type layer, an active layer and a p-type layer, and top portions of the column portions are further etched so that top surfaces of the column portions are lower than that of a position of the active layer.

Effect of the Invention

Since nitride semiconductor is very hard material which is hardly etched by a wet etching process, chips can not be separated by dicing including etching for strain relaxation, in a light emitting device using nitride semiconductor. Therefore, the separation of chips is carried out by dicing or scribing a substrate after forming separation grooves at a region to be separated of the semiconductor lamination portion by a dry etching process. In the present invention, since a separation groove region is etched such that a perfect groove is not formed but parts of the semiconductor lamination portion of a column shape are left to stand side by side, if light reflected at a substrate side enters into the column portion, the light becomes easy to be taken out because an incident angle changes in a narrow region, and then efficiency of taking out the light can be raised. Namely, when total reflection occurs within a quadrilateral region of the substrate or the semiconductor lamination portion, total reflection is repeated easily because the incident angle does not change so often, and furthermore, the light is easy to attenuate because of a long distance of transmitting within semiconductor layers. However, when reflection is repeated within a narrow region, the incident angle changes easily and the light is easy to be taken out before attenuation. As a result, external quantum efficiency can be remarkably improved.

In addition, since the semiconductor lamination portion of a column shape (column portion) can be formed by the completely same process as a conventional process only by making a mask so as not to etch the column portion in the conventional process of etching the semiconductor lamination portion at a surrounding region of a chip, the external quantum efficiency can be improved without adding any production manhour and increasing of production cost.

Further, as light generated in the semiconductor lamination portion (mesa structure portion) of a center part of the chip is transmitted not only to a substrate side or a surface side but also to a side surface side, when the column portions are formed by etching the semiconductor lamination portion as described above, the light radiated from a side surface (side wall) of the mesa structure attenuates by being shut by the semiconductor lamination portion of the column shape (column portions), or is absorbed by entering inside of the semiconductor lamination portion of the column portions, because a height of each of the semiconductor lamination portions of the column portions is same as that of the semiconductor lamination portion of the center part (mesa structure) of the chip. But, as in the present invention, since the column portions are provided apart from the mesa structure portion, or a top portion of each of the column portions is etched and removed in order to shorten the column portions so that a top surface of each of the column portions is lower than that of a position of an active layer of the mesa structure portion, light radiated from the mesa structure portion to a side is not shut by the column portions, and is not absorbed by the semiconductor lamination portion of the column portions thereby, efficiency of taking out light can be further improved. As a result, the external quantum efficiency can be further improved.

EXPLANATION OF LETTERS AND NUMERALS

Figure 1:
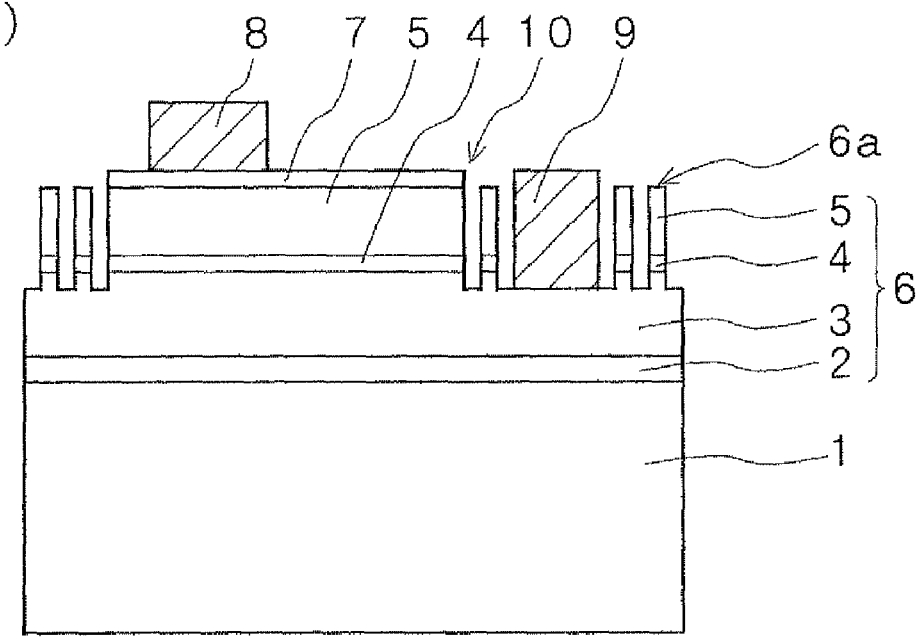
FIG. 1 is a cross-sectional view and a plan view explaining an embodiment of the semiconductor light emitting device according to the present invention.
Figure 1:
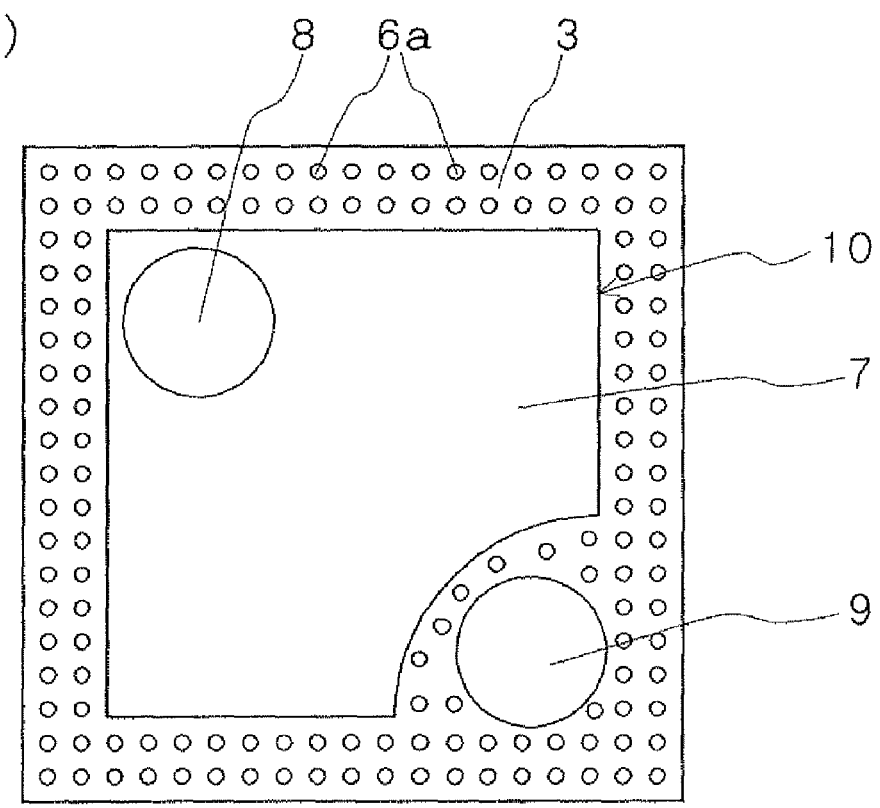

1: substrate
3: n-type layer
4: active layer
5: p-type layer
6: semiconductor lamination portion
6a: semiconductor lamination portion of a column shape (column portion)
7: light transmitting conductive layer
8: p-side electrode
9: n-side electrode
10: mesa structure portion

THE BEST EMBODIMENT OF THE PRESENT INVENTION

An explanation will be given below of a semiconductor light emitting device according to the present invention and a method for manufacturing the same in reference to the drawings. A cross-sectional view and a plan view explaining an embodiment of the semiconductor light emitting device according to the present invention in which nitride semiconductor layers suitable for emitting blue light are laminated on a sapphire substrate are shown in FIG. 1.

In the semiconductor light emitting device according to the present invention, as shown in FIG. 1, a semiconductor lamination portion 6 made of nitride semiconductor, including a first conductivity type layer and a second conductivity type layer, is laminated on a surface of a substrate 1 made of, for example, sapphire (single crystal of $Al_2O_3$) or the like. A first electrode (for example, p-side electrode 8) is provided so as to be electrically connected to the first conductivity type layer (for example, p-type layer 5) on a surface side of the semiconductor lamination portion 6, and a second electrode (for example, n-side electrode 9) is provided so as to be electrically connected to the second conductivity type layer (for example, n-type layer 3). And a mesa structure portion 10 of the semiconductor lamination portion is formed by etching a part of the semiconductor lamination portion 6 at a surrounding region of a chip so as to expose the second conductivity type layer 3, at the same time, column portions 6a are formed by leaving parts of the semiconductor lamination portion such that the column portions stand side by side, and the n-type layer 3 is exposed at a surrounding region of the column portions 6a.

Figure 4:
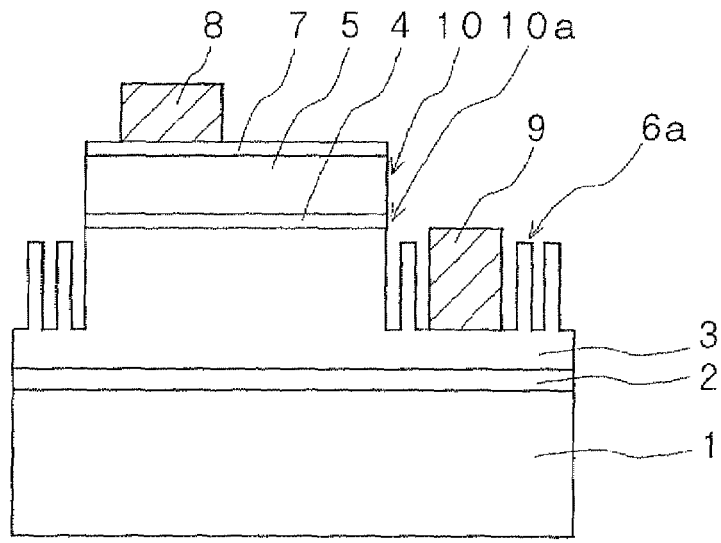
FIG. 4 is a cross-sectional view explaining another embodiment of the semiconductor light emitting device according to the present invention.

In an example shown in FIG. 1, a sapphire substrate of an insulating substrate is used for the substrate 1. Then, the n-type layer 3 of a lower conductivity type layer is exposed by removing a part of the semiconductor lamination portion 6 by etching, and the n-side electrode 9 is formed on the surface thereof. However, a semiconductor substrate such as SiC can be used for the substrate 1 as shown in FIG. 4. In this case, it is also preferable to separate a dividing region of the semiconductor lamination portion 6 by a dry etching process beforehand with dividing a wafer into light emitting chips, because a problem does not arise such that cracks occurs in a light emitting layer, thereby a light emitting device excellent in internal quantum efficiency can be manufactured. And in such etching process, column portions 6a can be formed easily only by making a mask such that parts of the semiconductor lamination portion 6 of a column shape are left in the dividing region.

The semiconductor lamination portion 6 is formed, for example, in a structure described below. There are laminated following layers in order respectively, that is, a low temperature buffer layer 2 made of, for example, GaN and having a thickness of approximately 0.005 to 0.1 µm, the n-type layer 3 made of GaN doped with Si or AlGaN based compound and having a thickness of approximately 1 to 10 µm, an active layer 4, having a structure of a multiple quantum well (MQW), formed in a thickness of approximately 0.05 to 0.3 µm, by laminating 3 to 8 pairs of well layers made of $In_{0.13}Ga_{0.87}N$ and having a thickness of 1 to 3 nm and barrier layers made of GaN and having a thickness of 10 to 20 nm, and the p-type layer 5 made of p-type GaN or AlGaN based compound semiconductor and having a thickness of approximately 0.2 to 1 µm. Although, both of the n-type layer 3 and the p-type layer 5 are composed of single layer in the example shown in FIG. 1, multiple layers may be formed of, for example, a barrier layer (a layer with a large band gap energy), which confines carrier easily, made of AlGaN based compound and formed at an active layer side, and a contact layer, which raises carrier density easily, made of GaN and formed at an opposite side of the active layer 4, furthermore, other layers such as a high temperature buffer layer undoped, n-typed or the like, a super lattice layer releasing strains between each layer, or the like, may be interposed on the low temperature buffer layer. And these layers may be formed by other nitride semiconductor layer.

Although, in this example, a double hetero structure is shown in which the active layer 4 is sandwiched by the n-type layer 3 and the p-type layer 5, a structure of a p-n junction can be used in which the n-type layer and the p-type layer are directly joined. And the active layer 4 is not limited to the MQW structure described above, a single quantum well structure (SQW) or a bulk structure can be employed.

The n-type layer 3 is exposed by etching the semiconductor lamination portion 6 at a surrounding region of a chip and a region for forming the n-side electrode so as to form a mesa structure portion 10 at a center part of the chip of the semiconductor lamination portion 6. At this time, although etching is carried out for whole area of the region for forming the n-side electrode 9, the semiconductor lamination portion 6 of the region surrounding a chip and the n-side electrode 9 are not etched thoroughly but etched such that column portions 6a are left and stand side by side as shown in FIG. 1. Each of the column portions 6a is formed in a size having a thickness of approximately several micron meters, for example 5 μm in diameter, and a distance of approximately several micron meters, for example 2 μm (a pitch of 7 μm). Although the column portions 6a are shown in two rows around the chip in the example shown in FIG. 1, four or more rows are actually formed around the chip because adjacent rows of the column portions 6a of the above-described size are arranged with a shift by a half pitch, and because a width around the chip is approximately 25 to 40 μm.

Though a size, distance and arrangement of the column portions 6a are not limited to those of the example, and patterns can be changed freely. In this case, a small pitch of the column portions 6a and a large number of those are preferable to take out light easily. A column portion near to a center part of the semiconductor lamination portion (mesa structure portion) of a chip in which emits light is arranged preferably 0.5 μm or more apart from the mesa structure portion, because light radiated in a lateral direction, emitted in the mesa structure portion, is shut and attenuates when the distance from the mesa structure portion is too small like a distance of 0.5 μm or less.

A height of each of the column portions 6a is formed in approximately 0.1 to 10 μm, preferably approximately 0.5 to 5 μm, more preferably approximately 1 to 2.5 μm, since etching is carried out from a surface of the semiconductor lamination portion 6 till the n-type layer 3 is exposed. Although the deeper etching is more preferable to improve luminance, a depth of approximately 1 to 2.5 μm is most effective because improvement in luminance can not be obtained even if etching is carried out so deeply, furthermore it takes long time to etch too deeply because of a small etching rate of approximately 0.13 μm/min.

Figure 2:
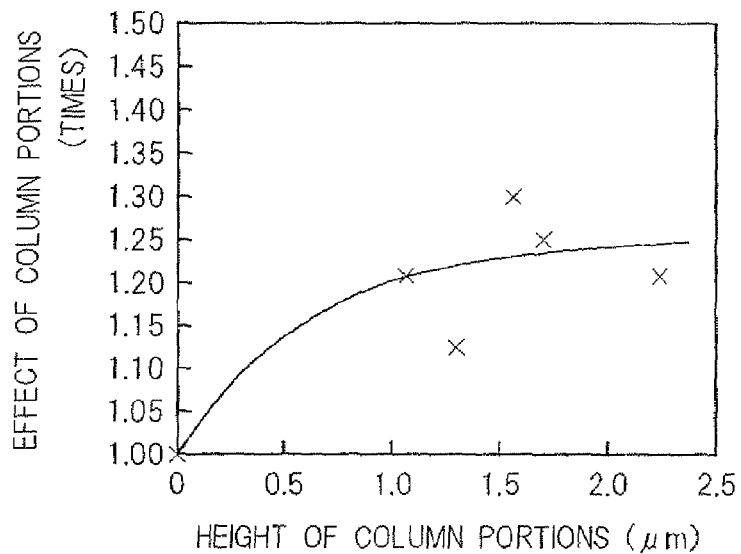
FIG. 2 is a figure showing a variation of luminance to a variation of a height of column portions of FIG. 1.

The present inventors formed a light emitting device by the above-described structure of the semiconductor lamination portion 6, and examined a variation of a luminance when a height of the column portions 6a was changed variously by using the above-described pattern. At this time, the height was changed by changing a depth of etching an n-type layer 3 after forming the n-type layer 3 in a thickness of approximately 10 μm. There are shown in FIG. 2 a change of a value (longitudinal axis) obtained by dividing a value of output observed when the height of the column portions 6a, namely a depth of etching, is changed from 1 to 2.5 μm (lateral axis), by a value of output observed when whole area of the n-type layer 3 of a surrounding region of a chip is exposed by etching the surrounding region of a chip perfectly without forming column portions. It is obvious from FIG. 2 that the luminance is improved as the height of the column portions 6a increases, the luminance is enhanced drastically to 1.2 times of that in case without the column portion 6a, in a height of approximately 1 to 1.5 μm, and thereafter the luminance increases gently. On the contrary, if the column portions are formed too high, the n-type layer 3 becomes thin which leads to increasing a direct current resistance, and if the p-type layer or the like is formed thick so as to increase the height, time for epitaxial growing becomes long, further time for etching also becomes long, and a production cost increases. Therefore, a height of approximately 1 to 1.5 μm is most preferable as described above.

Further, as a plan shape of the column portion 6a is not limited to a circular shape shown in FIG. 1, a polygonal shape such as a triangular shape, a quadrilateral shape or the like may be used. But, the circular shape is preferable since light is taken out easily from the column portions 6a because an incident angle of light can be made small easily.

The column portions 6a can be formed by a dry etching process such as that for etching at a surrounding region of a chip and forming the n-side electrode 9, by the prior art. In this case, the column portions 6a can be formed in a predetermined pattern by the dry etching process by forming a pattern of the column portions 6a of the above-described size and pitch in a mask formed with an insulating film such as $SiO_2$ or the like, or a photo resist or the like. The dry etching can be carried out, for example, by a plasma etching method using gasses of chlorine and silicon tetrachloride for an etchant.

On the semiconductor lamination portion 6, a light transmitting conductive layer 7 made of ZnO, a specific resistivity of which is set to approximately $5 \times 10^{-4}$ Ω·cm by doping, for example, Ga, is formed in a thickness of approximately 0.1 to 10 μm, for example 0.5 μm. Then, the n-side electrode 9 for ohmic contact is formed on the n-type layer 3 exposed by etching and removing a part of the semiconductor lamination portion 6 as an alloy layer formed by sintering laminated layers of a Ti film of a thickness of approximately 0.01 μm and an Al film of a thickness of approximately 0.25 μm, at a temperature of approximately 600° C., and the p-side electrode 8 is formed on a part of the light transmitting conductive layer 7, by a lamination structure of a Ti film of a thickness of approximately 0.1 μm and an Au film of a thickness of approximately 0.3 μm. A passivation film (not shown in figures) made of $SiO_2$ or the like is formed on the whole surface except those of the p-side electrode 8 and the n-side electrode 9. As the light transmitting conductive layer 7 is not limited to ZnO, ITO or a thin alloy layer of Ni and Au having a thickness of approximately 2 to 100 nm can be used and diffuse electric current to whole part of a chip while transmitting light.

Figure 3:
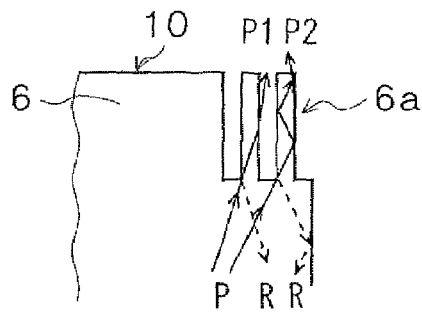
FIG. 3 is a figure explaining that light is taken out easily by column portions of the semiconductor light emitting device.

As an enlarged view of a part of the column portions 6a is shown in FIG. 3, according to the present invention, light traveling toward a substrate side or a part of light totally reflected at a surface after traveling toward a surface side, among light emitted in the active layer 4, turns back to the surface side by reflecting at an interface of nitride semiconductor layers and the substrate 1 or a back surface of the substrate. Though, light P traveling toward the column portions 6a among the light enters inside of the column portions 6a, and there increases light (P1) taken out by refracting at a side wall of the column portions 6a or light (P2) taken out of the surface after reflecting totally within the column portions 6a. If the column portions 6a are not provided, light is totally reflected again (R) at a surface of the n-type layer 3 exposed, total reflection is repeated within the semiconductor layer or the substrate 1, and light which attenuates increases. Namely, since, in the prior art, the n-type layer 3 is exposed by etching a part of the semiconductor lamination portion 6 at a region for forming the n-side electrode 9 and a dividing region surrounding a chip for dividing into chips by a dry etching process, light traveling toward the region is easily reflected totally as shown by R in FIG. 3 because the region is not provided with the column portions 6a, but provided with a flat surface. But, if light enters the column portions 6a, the light is taken out easily because the column portions 6a are narrow regions and directions of the exposed surface and sides of the column portions 6a are different 90 degrees.

As described above, the n-type layer 3 at a region of the prior art surrounding a chip is exposed by etching before dividing a wafer. This is for preventing remarkable deterioration of internal quantum efficiency easily caused by cracks entered in the active layer, since cracks easily occur in the dicing process or the like when a wafer is diced or scribed, because nitride semiconductor is very hard material. On the contrary, when column portions 6a stand side by side in a dicing region as in the present invention, there exists possibility of occurrence of cracks in the column portions 6a. However, since the column portions 6a are not provided with a light transmitting conductive layer 7 on upper surfaces thereof and do not contribute to emitting light, no problem arises even if cracks occur because the column portions 6a stand independently, and, at the same time, there is not any worry about extending of the crack to a side of the active layer 4 under the light transmitting conductive layer 7. Therefore, the column portions 6a can be left and stand side by side without any hindrance. As a result, luminance can be improved to 1.13 to 1.3 times of that in case not forming the column portions 6a as shown in FIG. 2.

In the above-described example, although the column portions 6a are formed only at regions surrounding a chip and the n-side electrode 9a, an area of the column portions may be increased by decreasing an area of emitting light. In this case, although the area of emitting light decreases, internal quantum efficiency (ratio of output of emitted light to input) is not changed at last because an input power decreases due to decrease of the area, more light emitted can be taken out from the column portions, and efficiency of taking light out is remarkably improved. As a result, luminance in total can be improved.

And next, an explanation on a method for manufacturing the semiconductor light emitting device shown in FIG. 1 will be given below. A semiconductor lamination portion is formed by a method of metal organic compound vapor deposition (MOCVD), supplying necessary gasses such as a reactant gas like trimethyl gallium (TMG), ammonia ($NH_3$), trimethyl aluminium (TMA), trimethyl indium (TMI) or the like, and a dopant gas like $SiH_4$ for making an n-type, or a dopant gas like biscyclopentadienyl magnesium ($Cp_2Mg$).

At first, the low temperature buffer layer 2 made of a GaN layer is formed on the insulating substrate 1 made of, for example sapphire, in a thickness of approximately 0.005 to 0.1 μm, at a low temperature of, for example, approximately 400 to 600° C., thereafter, the n-type layer (barrier layer) 3 made of n-type GaN is formed in a thickness of approximately 1 to 10 μm by raising a temperature to a high temperature of approximately 600 to 1200° C. And at a lowered temperature of 400 to 600° C., the active layer 4 is formed which has a structure of a multiple quantum well (MQW) formed in a thickness of approximately 0.05 to 0.3 μm by laminating 3 to 8 pairs of the well layer made of, for example, $In_{0.13}Ga_{0.87}N$ and having a thickness of 1 to 3 nm, and the barrier layer made of GaN and having a thickness of 10 to 20 nm. And, the p-type layer 5 made of GaN is laminated 0.2 to 1 μm thick in total by raising a temperature in a growth furnace to approximately 600 to 1200° C.

Thereafter, a protective film made of SiN or the like is provided on a surface of the semiconductor lamination portion 6, and annealing is carried out at a temperature of approximately 400 to 800° C. for approximately 10 to 60 minutes to activate the p-type dopant. Then, a photo resist is coated on the whole surface, and patterned by a photolithography process. At this time, a mask is formed by patterning a photo resist film so as to form column portions 6a in a surrounding region of the chip and the n-side electrode. Thereafter, the wafer is set in an inductively coupled type plasma etching system, and, for example, chlorine gas of 50 sccm and silicon tetrachloride gas of 5 sccm are provided with a pressure of 0.6 Pa inside of the system. An RF power supplying to an upper coil was set at approximately 150 W, and an RF power to a lower electrode for drawing plasma was set at 50 W. As a result, the n-type layer 3 is exposed by etching a part of the semiconductor lamination portion 6, which is exposed not covered by the mask, at a surrounding region of the chip and a region for forming the n-side electrode. An etching rate of this time was approximately 0.13 μm/min and a depth of etching in approximately 20 min was 2.5 μm. A pattern of the column portions 6a can be chosen freely by the above-described patterning of mask.

Subsequently, a light transmitting conductive layer 7 is formed by depositing a ZnO layer doped with, for example, Ga in a thickness of approximately 0.5 μm by a method of such as MBE, sputtering, vapor deposition, PLD, ion plating or the like. Then, the n-side electrode 9 is formed on the exposed surface of the n-type layer 3 by depositing a Ti film having a thickness of 0.1 μm and an Al film having a thickness of 0.25 μm and by sintering to make an alloy by applying a heat treatment of approximately 600° C. And, the p-side electrode 8 is formed similarly on a part of the light transmitting conductive layer 7 by depositing a Ti film having a thickness of 0.1 μm and an Au film having a thickness of 0.3 μm by using a lift-off method. As a result, an LED chip having a structure shown in FIG. 1 is obtained.

Figure 6:
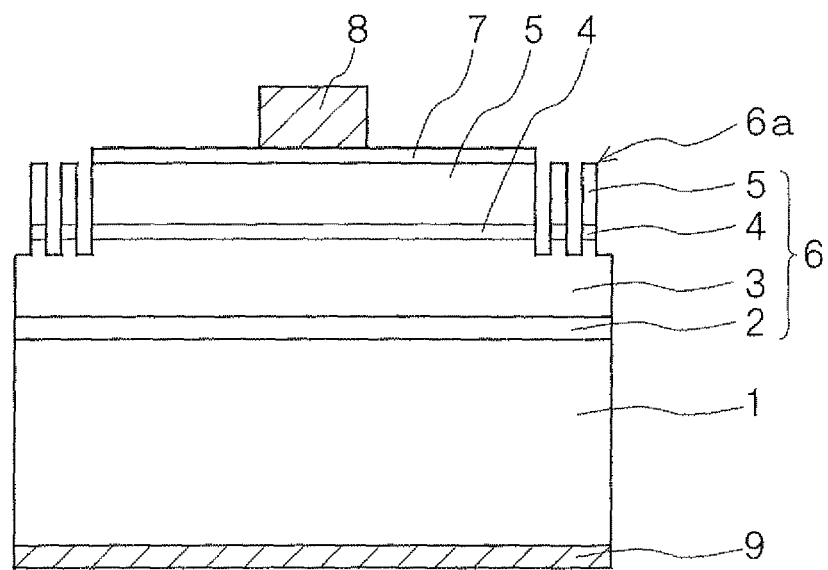
FIG. 6 is a cross-sectional view explaining still another embodiment of the semiconductor light emitting device according to the present invention.
Figure 7:
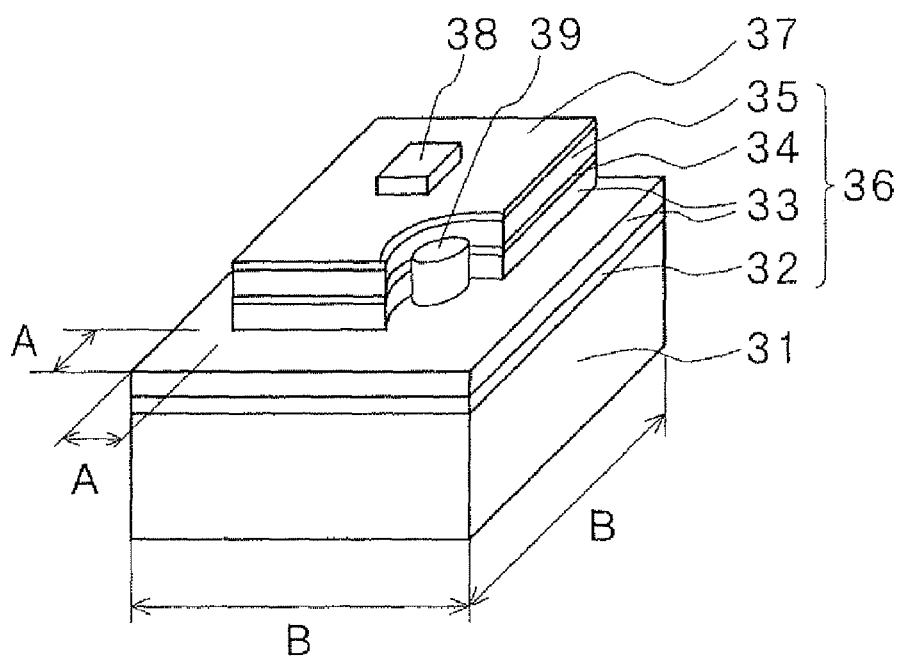
FIG. 7 is a perspective view explaining an LED by the prior art, using nitride semiconductor.
Figure 8:
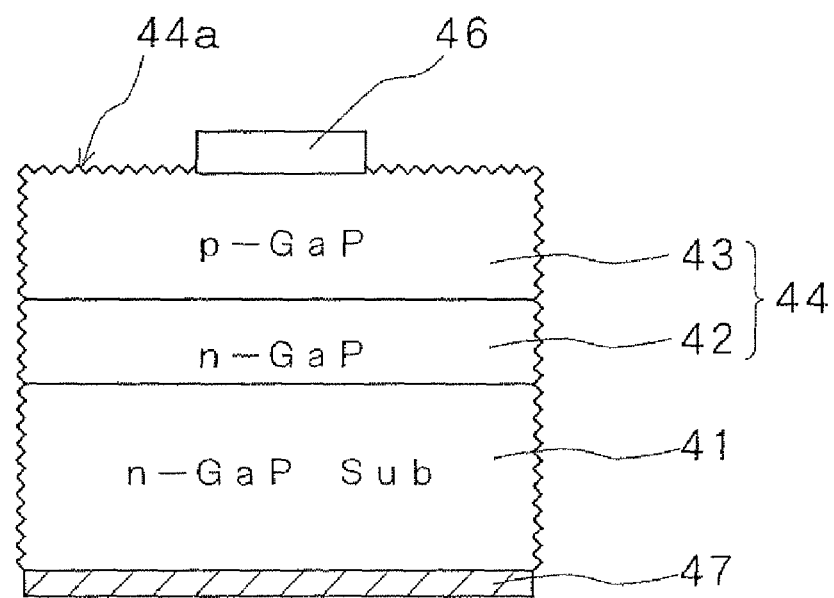
FIG. 8 is a cross-sectional view explaining an example of an LED by the prior art, using GaP, in which the unevenness is formed on a surface.

In the above-described example, the n-side electrode 9 is formed by exposing the n-type layer 3 by etching a part of the semiconductor lamination portion 6, because the substrate is the sapphire substrate of an insulating substrate, and at the same time, the column portions 6a are formed in a surrounding region of the chip and the n-side electrode. However, even in case that the substrate is a semiconductor substrate such as SiC, it is preferable that column portions are formed so as to stand side by side in a surrounding region of the chip from the aspects of protection of the active layer on dividing into chips and improvement of external quantum efficiency. The example of this case is shown in FIG. 6. In this example, since the substrate is not an insulating substrate but a semiconductor substrate, the electrode 9 is not formed on the n-type layer 3 exposed by removing a part of the semiconductor lamination portion by etching, but simply formed on a back surface of the semiconductor substrate 1, and other processes are similar to those of the above-described example.

Namely, the semiconductor lamination portion 6 is formed, on the SiC substrate 11, with the low temperature buffer layer 2, the n-type layer 3, the active layer 4 and the p-type layer 5, and etched at a surrounding region of the chip is etched such that column portions 6a stand side by side. In this case, the p-side electrode 8 is formed on a surface of the light transmitting conductive layer 7 approximately at a center of the chip by using same material as described above, and the n-side electrode 9 is formed on the whole back surface of the SiC substrate 1 by forming, for example, a Ni film.

Although a height of the column portions is same as that of a center part of the chip (the mesa structure portion) in each example described above, if top portions of the column portions 6a are removed by further etching, efficiency of taking light out is improved and external quantum efficiency is raised, as shown in FIG. 4. Concretely, the second conductivity type layer (n-type layer) 3 is exposed by removing the first conductivity type layer (p-type layer) 5 and the active layer 4, which compose a part of the column portions 6a, by etching. Further, it is preferable that the column portions 6a neighboring to the mesa structure portion 10 of the center part of the chip are arranged so as to be apart 0.5 μm or more from the side surface 10a of the mesa structure portion 10, thereby it is possible to inhibit the shut and attenuation of light emitted from the mesa structure portion 10 of the center part of the chip and radiated from a side surface 10a.

Figure 5:
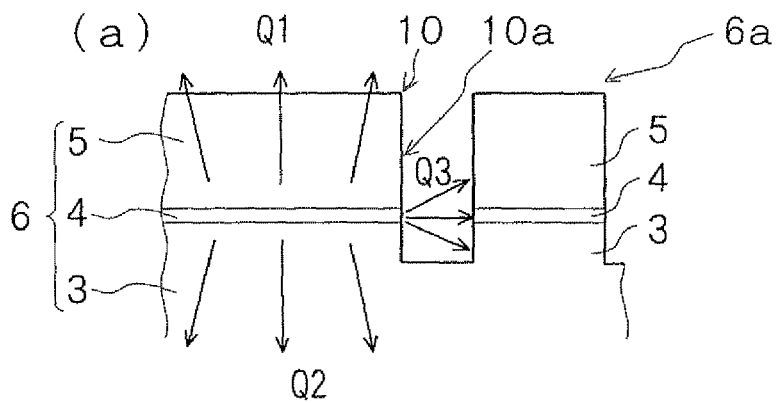
FIG. 5 is a figure explaining that light is taken out easily by a structure shown in FIG. 4.

In other words, as an enlarged view of a part of the mesa structure portion 10 and a column portion 6a neighboring to it in FIG. 5(a), light emitted in the active layer 4 travels in every direction such as light (Q1) traveling toward a surface side or light (Q2) traveling toward the substrate side, and finally is radiated outside through the surface side, side surface of the semiconductor lamination portion 6 and the substrate 1, and column portions 6a. On the other hand, since light (Q3) traveling toward a side direction is radiated from the side surface 10a, the light is shut and attenuated by the column portion 6a before spreading sufficiently, if the column portion 6a stands at a neighboring region just beside the side surface 10a. Concretely, it was examined by an experiment that the influence is large when the column portion 6a is arranged in a region apart 0.5 μm or less from the side 10a of the mesa structure 10. Then, the column portion 6a is preferably arranged apart at least 0.5 μm or more from the side surface 10a of the mesa structure portion 10.

Further, since an inside of the column portions 6a is also composed of the n-type layer 3, the active layer 4 and the p-type layer 4, if light radiated from the side surface 10a of the mesa structure portion 10 enters into the column portions 6a, the light also enters into the active layer 4 in the column portions 6a, the light is absorbed at the active layer 4 in the column portions 6a, the light (Q3) radiated from the side surface 10a is not taken out sufficiently, and the external quantum efficiency is not improved. Then, in order to inhibit absorption of light in the active layer 4 in the column portions 6a and also to inhibit shutting light emitted in the active layer 4 of the mesa structure portion 10 and radiated directly to a lateral direction, by the column portions 6a, it is preferable that as shown in FIG. 5(b), a top surface of each of the column portions 6a is set so as to be lower than that of a position of the light emitting layer (active layer 4) by removing the column portions 6a by etching until the n-type layer 3 of the column portion 6a is exposed. Thereby, the light (Q3) radiated from the side surface is neither shut nor absorbed in the column portions 6a and the external quantum efficiency is further improved.

A method for manufacturing such semiconductor light emitting device is same as that of the semiconductor light emitting device shown in FIG. 1 described above except forming column portions 6a. Namely, in the same method as that of the semiconductor light emitting device shown in FIG. 1, semiconductor layers are laminated, annealing treatment is carried out, the column portions 6a are formed by etching a part of the semiconductor lamination portion 6 so as to expose a semiconductor layer of a conductivity type of a substrate 1 side. Thereafter a mask is formed so as to expose only the column portions 6a and to cover a mesa structure portion 10 or the like, and top portions of the column portions 6a are etched until the n-type layer 3 is exposed. Since the following process is same as that of the semiconductor light emitting device shown in FIG. 1, an explanation is omitted.

More concretely, after a process of exposing the n-type layer 3 and forming the column portions 6a, at the same time, a mask (not shown in figures) covering the mesa structure portion 10 is formed by coating a photo resist further on the whole surface, and exposing only the column portions 6a by patterning in a photolithography process. Thereafter, the following process is carried out by setting the wafer in an inductively coupled type plasma etching system with flowing, for example, chlorine gas of 50 sccm and silicon tetrachloride gas of 5 sccm and with fixing a pressure inside of the system at 0.6 Pa with setting an RF power to an upper coil at approximately 150 W, and an RF power to a lower electrode for drawing plasma at 150 W. As a result, the n-type layer 3 is exposed by etching the p-type layer 5 and the active layer 4 in the column portions 6a in a surrounding region of the chip, which is exposed not covered by the mask. By this process, the column portions 6a can be formed lower than the device shown in FIG. 1. Thereafter, by carrying out same process as that for the semiconductor light emitting device shown in FIG. 1 a semiconductor light emitting device having a structure shown in FIG. 4 can be obtained.

Although the n-type layer 3 exposed in a surrounding region of the column portions 6a is further etched if etching is carried out by forming a mask to cover only the mesa structure portion 10, there arises no problem because the n-type layer 3 is sufficiently thick, and it is preferable because a position of the top portions can be lowered while keeping the column portions in the same heights (lengths). However, only a top portion of the column portions 6a can be etched by forming a mask so as to cover also the n-type layer 3 exposed in the surrounding region of the column portions 6a, at the time of covering the mesa structure portion 10. In this case, there arises no problem even if the n-type layer is thin because the exposed n-type layer is not etched any more.

INDUSTRIAL APPLICABILITY

The light emitting device by the present invention can be used for back lights for liquid crystal display devices or the like, light sources of every kinds, traffic signals or lighting devices for replacing electric lamps or the like, and electronic appliance of every kinds.

The invention claimed is:

1. A semiconductor light emitting device comprising:
a substrate;
a semiconductor lamination portion made of nitride semiconductor, including a first conductivity type layer and a second conductivity type layer provided on the substrate, an active layer being formed between the first and second conductivity type layers;
a first electrode electrically connected to the first conductivity type layer which is provided on a surface side of the semiconductor lamination portion; and
a second electrode provided electrically connected to the second conductivity type layer, wherein
column portions and a mesa structure portion of the semiconductor lamination portion are formed by etching a part of the semiconductor lamination portion at a surrounding region of a chip so as to expose the second conductivity type layer, the column portions standing side by side, a to surface of each of the column portions being lower than a bottom surface of the active layer.

2. The semiconductor light emitting device according to claim 1, wherein the column portions include adjacent first and second rows of column portions, a distance between one of the column portions in the first row and a corresponding one of the column portions in the second row is half of a distance between adjacent ones of the column portions in the first row.

3. The semiconductor light emitting device according to claim 1, wherein a distance between a side wall of the mesa structure portion and a column portion which is the nearest column portion to the side wall is set at least 0.5 μm or more.

4. The semiconductor light emitting device according to claim 1, wherein the substrate is formed with an insulating substrate, the second conductivity type layer is exposed by etching the part of the semiconductor lamination portion, the second electrode is provided on a surface of the exposed second conductivity type layer, and the column portions are formed on a surrounding region of the second electrode.

5. The semiconductor light emitting device according to claim 2, wherein the substrate is formed with an insulating substrate, the second conductivity type layer is exposed by etching the part of the semiconductor lamination portion, the second electrode is provided on a surface of the exposed second conductivity type layer, and the column portions are formed on a surrounding region of the second electrode.

6. The semiconductor light emitting device according to claim 1, wherein each of the column portions is of a cylinder shape.

7. The semiconductor light emitting device according to claim 1, wherein the column portions stand side by side in a dicing region, and are formed at a portion thereof adjacent to a face of dicing.

* * * * *